United States Patent
Kwon

(10) Patent No.: US 7,262,651 B2
(45) Date of Patent: Aug. 28, 2007

(54) DIFFERENTIAL INPUT BUFFER CIRCUIT WITH RAIL-TO-RAIL INPUT RANGE

(75) Inventor: Hyuk-Joon Kwon, Gunpo-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 11/258,958

(22) Filed: Oct. 26, 2005

(65) Prior Publication Data

US 2006/0139066 A1 Jun. 29, 2006

(30) Foreign Application Priority Data

Dec. 28, 2004 (KR) .................. 10-2004-0113586

(51) Int. Cl.
*H03L 5/00* (2006.01)
(52) U.S. Cl. .................. 327/333; 327/52; 327/65; 326/68; 326/81
(58) Field of Classification Search ............. 327/112
See application file for complete search history.

(56) References Cited

U.S. PATENT DOCUMENTS

| | | | | |
|---|---|---|---|---|
| 4,769,564 A | * | 9/1988 | Garde | 327/52 |
| 4,958,133 A | * | 9/1990 | Bazes | 330/253 |
| 5,162,681 A | * | 11/1992 | Lee | 327/53 |
| 5,311,145 A | | 5/1994 | Huijsing | 330/255 |
| 6,169,424 B1 | * | 1/2001 | Kurd | 327/53 |
| 6,278,323 B1 | * | 8/2001 | Bazes | 330/257 |
| 6,778,014 B2 | | 8/2004 | Rennig | 330/253 |

\* cited by examiner

*Primary Examiner*—Tuan T. Lam
*Assistant Examiner*—William Hernandez
(74) *Attorney, Agent, or Firm*—F. Chau & Assoc., LLC

(57) ABSTRACT

An input buffer circuit achieving rail-to-rail operation maintains a uniform common mode output voltage even though an input signal having any voltage level is inputted. The input buffer circuit has a differential amplifier structure receiving two differential input signals. A first input part has a first inverter circuit into which a first differential input signal is inputted, and a second input part has a second inverter circuit into which the second differential input signal is inputted. The first inverter circuit has a first output node connected to a diode structure having an operating current twice the operating current of the first inverter circuit, and outputs a first output signal. Rail-to-rail operation is achieved, and a common mode output voltage is provided uniformly, with reduced current consumption.

22 Claims, 7 Drawing Sheets

US 7,262,651 B2

DIFFERENTIAL INPUT BUFFER CIRCUIT WITH RAIL-TO-RAIL INPUT RANGE

BACKGROUND OF THE INVENTION

1. Field of the Invention

The present invention relates to an input buffer circuit having rail-to-rail operation and a differential amplifier structure.

2. Description of the Related Art

In a semiconductor memory device an input buffer circuit is generally used to change the voltage level of a signal inputted from the outside to a voltage level matching the interior operating voltage of the semiconductor memory device. In general a signal inputted to a semiconductor memory device from the outside has a TTL (Transistor-Transistor Logic) level, and a signal used within a semiconductor memory device has a CMOS (Complementary Metal Oxide Semiconductor) level. The signal inputted to the semiconductor memory device from the outside cannot be used unchanged in the interior of the semiconductor memory device, thus an input buffer is used to convert the voltage level of the signal applied from the outside into a voltage level matching the interior of the semiconductor memory device.

Such an input buffer circuit may have a differential amplifier structure. In an input buffer circuit having a differential amplifier structure, the operating range of the output terminal and input terminal decides the operating voltage range of the amplifier. The operating range of the input terminal is decided by the design of the differential amplifier, and herein, the operating range of the differential amplifier is called a common-mode input range. The common-mode input range decides an input dynamic range in a buffer circuit such as a voltage follower. An input buffer circuit that is operable in the entire input range of the amplifier, from a smallest value (a ground potential), to a largest value (the supply power voltage), is called an input buffer circuit having "rail-to-rail" operation.

The ideal input buffer circuit has rail-to-rail operation and simultaneously has a uniform trans-conductance in over the entire common-mode input range. The trans-conductance (gm) is the ratio of an input current change to input voltage change.

FIG. 1 illustrates a conventional input buffer circuit having a differential amplifier structure of a NMOS current mirror.

Referring to FIG. 1, a conventional input buffer circuit having a differential amplifier structure of a NMOS current mirror includes PMOS transistors MP1 and MP2, NMOS transistors MN1 and MN2, and a current source I0.

The PMOS transistors MP1 and MP2 have the configuration of a current mirror and are the same size. The PMOS transistor MP1 is connected between a power source voltage terminal VCC and a first node N1, and the PMOS transistor MP2 is connected between a power source voltage terminal VCC and a second node N2.

The NMOS transistors MN1 and MN2 are input transistors configured to receive applied differential input signals VINN and VINP, and are the same size. The NMOS transistor MN1 is connected between the first node N1 and the current source I0. The NMOS transistor MN2 is connected between the second node N2 and the current source I0. One end of the current source I0 is connected with the NMOS transistors MN1 and MN2, and another end thereof is connected to a ground terminal.

Operation of the input buffer circuit will be described as follows, under the assumption that a voltage level of first input signal VINN is higher than the second input signal VINP.

The NMOS transistor MN1 is driven by the first input signal VINN, thus current flows in the NMOS transistor MN1. The NMOS transistor MN2 is driven by the second input signal VINP, and so current flows in the NMOS transistor MN2 with smaller volume than the current through the NMOS transistor MN1. The voltage level of the first node N1 decreases due to current flowing in the NMOS transistor MN1, and so more current flows through the PMOS transistor MP1. Also current flows in the PMOS transistor MP2. The current flowing in the NMOS transistor MN2 is uniform, thus a voltage at the second node N2 increases, and is outputted as an output signal VO.

FIG. 2 illustrates a conventional input buffer circuit having a differential amplifier structure of a PMOS current mirror.

As shown in FIG. 2, a conventional input buffer circuit having a differential amplifier structure of a PMOS current mirror includes PMOS transistors MP3 and MP4, NMOS transistors MN3 and MN4, and a current source I0.

The NMOS transistors MN3 and MN4 have the configuration of a current mirror and are the same size. The NMOS transistor MN3 is connected between a third node N3 and a ground node, and the NMOS transistor MN4 is connected between a fourth node N4 and the ground node. The PMOS transistors MP3 and MP4 are input transistors receiving an applied differential input signal VINN-VINP, and are the same size. The PMOS transistor MP3 is connected between the third node N3 and a current source I0 one end of which is coupled with a power source voltage terminal VCC. The PMOS transistor MP4 is connected between the fourth node N4 and a current source I0 one end of which is coupled with power source voltage terminal VCC.

Further description for operation of the input buffer circuit having a differential amplifier structure of a conventional PMOS current mirror is omitted as it is well known to those skilled in the art.

In such conventional input buffer circuits there is a limitation of the input buffer circuit in performing rail-to-rail operation within an input signal range. For example for the input buffer circuit shown in FIG. 1, in the case where an input signal range is below the level of threshold voltage Vth of the NMOS transistors MN1 and MN2, the input buffer circuit does not operate rail-to-rail. Furthermore in such conventional input buffer circuits there is a problem that a common mode voltage (CMV) of an output voltage is not uniform.

SUMMARY OF THE INVENTION

An exemplary embodiment of the invention provides an input buffer circuit, that is capable of rail-to-rail operation and that can uniformly maintain a common mode voltage of output voltage with any range of common mode input voltage.

According to one aspect of the invention, an input buffer circuit has a differential amplifier structure and thus having two (differential) in put signals comprises: a first input part having a first inverter circuit to which a first (differential) input signal is inputted: a second input pan having a second inverter circuit to which a second (differential) input signal is inputted: a pair of transistors configured to operate as diodes having an operating current twice an operating current of the first inverter circuit, and which connect with the first output signal of the first inverter circuit; and a second pair of transistors configured to operate as diodes, and which connect with the second output signal of the second inverter circuit, having an operating current twice an operating current of the second inverter circuit.

The input buffer circuit may further comprise a current source part one end of which is coupled with a power source voltage terminal, and a current sink part one end of which is coupled with a ground terminal. The first inverter circuit and the second inverter circuit are connected in parallel between the current source part and the current sink part. The input buffer circuit may further comprise a switching part for controlling the operating power source of the first and second diode parts in response to a control signal.

According to another aspect of the invention, an input buffer circuit of a differential amplifier structure and having two input signals, comprises: a first input part, which has a first P-channel transistor and a first N-channel transistor mutually connected in series and to which a first input signal between the two input signals is commonly inputted; a second input part, which has a second P-channel transistor and a second N-channel transistor mutually connected in series and to which a second input signal is commonly inputted; a a diode structure (e.g., a third P-channel transistor configured to operate as a diode) and a diode structure (e.g., a third N-channel transistor configured to operate as a diode) connected in series between the first node and the ground terminal, connected between the power source voltage terminal and a first output node of the first input part.

The input buffer circuit may further comprise a current source part one end of which is coupled with a power source voltage terminal, and a current sink part one end of which is coupled with a ground terminal. The first input part and the second input part are respectively connected in parallel between the current source part and the current sink part. A current amount flowing in the first diode part may be twice the current amount flowing in transistors constituting the first input part. A current amount flowing in a second diode output part may be twice the current amount flowing in transistors constituting the second input part. The first and second diode parts may be controlled by a first switching part for switching off the power supply voltage to the first and second diode parts. The first and second diode parts may be controlled by a second switching part for switching off a connection to the ground terminal.

According to another aspect of the invention, an input buffer circuit having a differential amplifier structure having two (differential) input signals, comprises a first input part having a first P-channel transistor and a first N-channel transistor arranged as an inverter that are commonly driven by a first differential input (one of the two differential input signals); a second input part, which is constructed of a second P-channel transistor and a second N-channel transistor that are configured as an inverter and that have an applied second differential input signal; a first control part, which is constructed of a third P-channel transistor configured as a diode connected between a power source voltage terminal and the first N-channel transistor, and a third N-channel transistor configured as a diode connected between the first P-channel transistor and a ground terminal; a fourth P-channel transistor configured as a diode connected between a first node and an output node and a fourth N-channel transistor configured as a diode connected between the output node and a second node, and which shares the output node of the second input part; and a second control part, which has a fifth P-channel transistor that is driven by the same signal as an input signal of the third P-channel transistor and that is connected between a power source voltage terminal and the first node, and a fifth N-channel transistor that is driven by the same signal as an input signal of the third N-channel transistor and that is connected between the second node and the ground terminal. The input buffer circuit may further comprise a current source part one end of which is coupled with a power source voltage terminal, and a current sink part one end of which is coupled with a ground terminal. The first input part and the second input part are connected in parallel between the current source part and the current sink part.

According to another aspect of the invention, an input buffer circuit having a differential amplifier structure and having two (differential) input signals comprises: a current source part one end of which is coupled with a power source voltage terminal; a current sink part one end of which is coupled with a ground terminal; a first input part having a first P-channel transistor and a first N-channel transistor that are commonly driven by the first differential input signal, the first P-channel transistor being connected between the current source part and a first node, and the first N-channel transistor being connected between the current sink part and a second node; a second input part having a second P-channel transistor and a second N-channel transistor that are commonly driven by the second differential input signal, the second P-channel transistor being connected between the current source part and a third node, and the second N-channel transistor being connected between the current sink part and a fourth node.

The third node and the fourth node may be connected with each other, constituting one output node. The input buffer circuit may further include a (non-inverting) buffer circuit that is constructed of an even number of inverters to buffer and output an output signal.

In such various configurations according to exemplary embodiments of the invention, rail-to-rail operation can be obtained, and a uniform common mode output voltage can be provided with any input range.

BRIEF DESCRIPTION OF THE DRAWINGS

The above and other features of the invention will become readily apparent to persons skilled in the art from the detailed description that follows. Exemplary embodiments of the invention are more fully described below with reference to FIGS. 3 to 8. This invention may, however, be embodied in many different forms and should not be construed as being limited to the exemplary embodiments set forth herein; rather, these exemplary embodiments are provided so that this disclosure is thorough and complete, and conveys the concept of the invention to those skilled in the art. In the figures.

DETAILED DESCRIPTION OF EXEMPLARY EMBODIMENTS OF THE INVENTION

Figure 1:
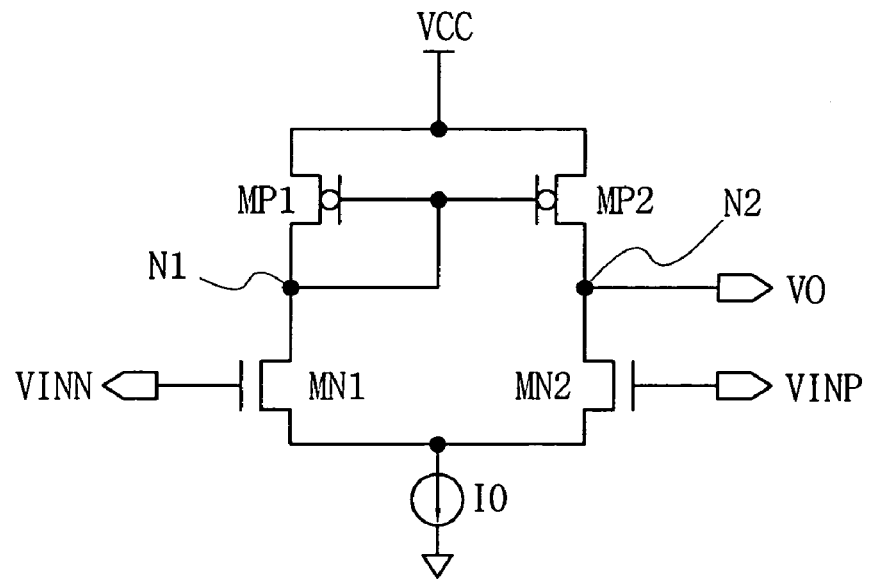
FIG. 1 is a circuit diagram of conventional NMOS current-mirror type differential amplifier.
Figure 2:
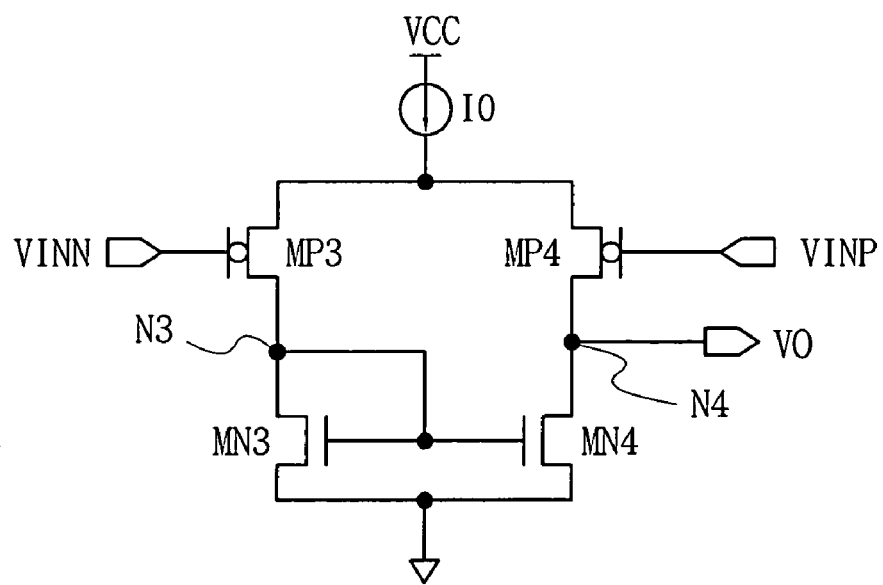
FIG. 2 is a circuit diagram of conventional PMOS current-mirror type differential amplifier.
Figure 3:
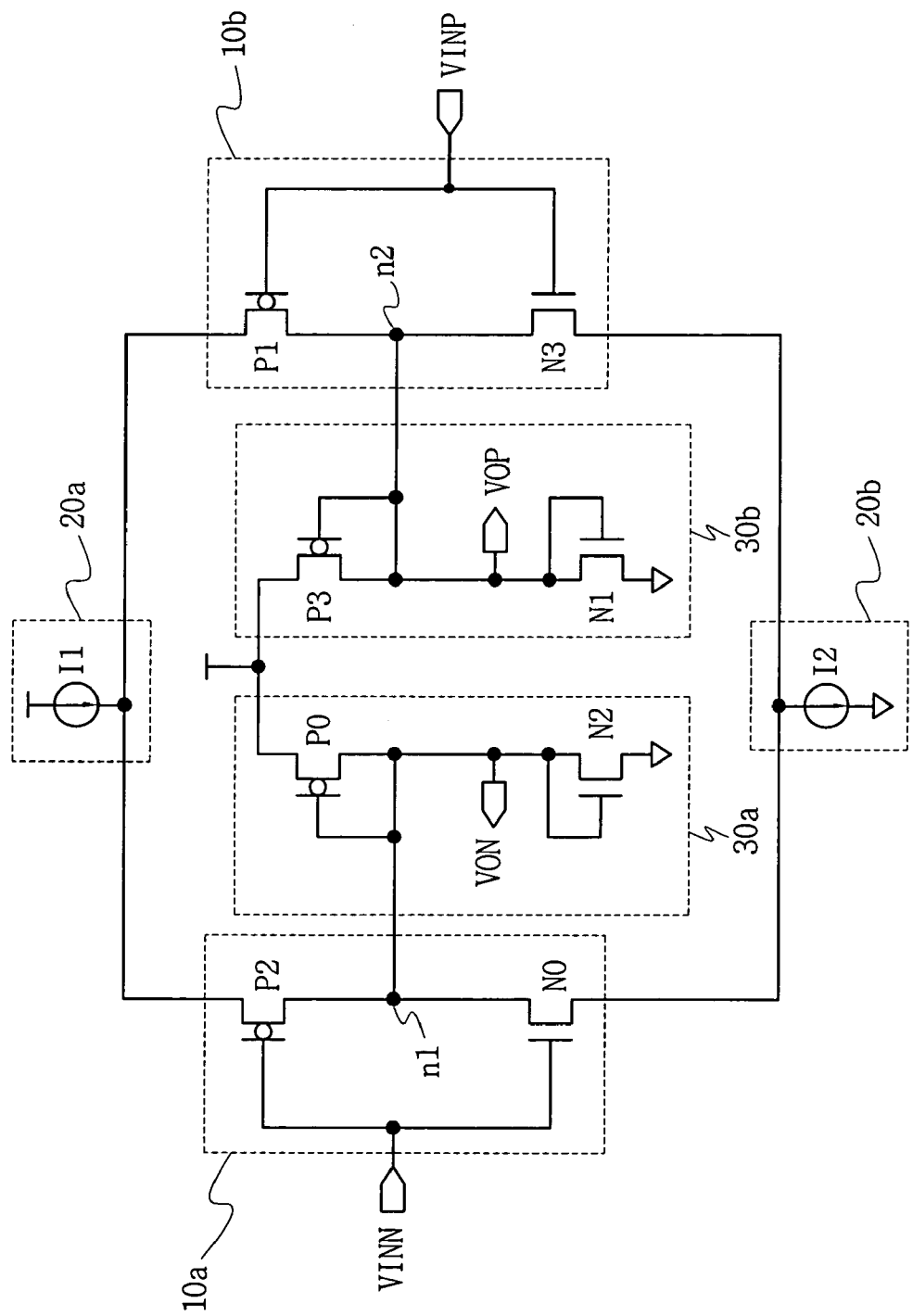
FIG. 3 is a circuit diagram of input buffer circuit according to a first exemplary embodiment of the invention.

FIG. 3 is a circuit diagram of input buffer circuit having a differential amplifier structure, according to a first exemplary embodiment of the invention.

Referring to FIG. 3, an input buffer circuit having a differential amplifier structure according to a first exemplary embodiment includes a current source part 20a, a current sink part 20b, a first input part 10a, a second input part 10b, a first output part 30a and a second output part 30b.

The current source part 20a includes a current source I1 one end of which is connected to a power source voltage terminal VCC and another end is connected to the first input part 10a and the second input part 10b. Thus, a voltage on a current source node is uniformly maintained, the current source node being connected between the first input part 10a and the second input part 10b and the current source part 20a.

A current sink node is connected to the current sink part 20b, the first input part 10a and the second input part 10b. The current sink part 20b is connected between the current sink node and a ground terminal, and so a voltage on the current sink node is maintained uniform.

The first input part 10a has an inverter circuit type and is configured to receive a first input signal VINN (e.g., one of two differential input signals) and has a first output node n1 (through which a first output signal, of the first input part 10a, is outputted). A first inverter is constructed of a first P-channel transistor P2 and a first N-channel transistor N0 that are connected in series with each other between the current source part 20a and the current sink part 20b (between the current source node and the current sink node). The first (differential) input signal VINN is commonly inputted to gate of the first P-channel transistor P2 and the gate of the first N-channel transistor N0.

The second input part 10b similarly has an inverter circuit type and is configured to receive a second input signal VINP (the other one of the two differential input signals) and has a second output node n2 (through which a second output signal, of the second input part 10a, is outputted). The second inverter circuit is constructed of a second P-channel transistor P1 and a second N-channel transistor N3 that are connected in series with each other, (and connected in parallel with the first input part 10a) between the current source part 20a and the current sink part 20b (between the current source node and the current sink node). The second input signal VINP is commonly inputted to gate of the second P-channel transistor P1 and to the gate of the second N-channel transistor N3.

The first P-channel transistor P2 of the first input part 10a, and the second P-channel transistor P1 of the second input part 10b have the same size; and likewise, the first N-channel transistor N0 of the first input part 10a, and the second N-channel transistor N3 of the second input part 10b have the same size.

The first output part 30a has a self-driving inverter (diode) circuit type having an input connected to the first output node n1 of the first input part 10a, and outputs a first output signal VON to the output node n1. The first output part 30a includes a third P-channel transistor P0 operating as a diode connected between the power source voltage terminal VCC and the first output node n1 (through which an output signal of the first input part 10a is outputted); and a third N-channel transistor N2 operating as a diode connected between the first output node n1 and the ground terminal. Thus the first output part 30a outputs the first output signal VON by using the first output node n1 as one of the differential amplifier's output nodes.

The second output part 30b has an self-driving inverter (diode) circuit type connected to the second output node n2 of the second input part 10b, and outputs a second output signal VOP to the output node n2. The second output part 30b includes: a fourth P-channel transistor P3 configured as a diode connected between the power source voltage terminal VCC and the second output node n2 (through which an output signal of the second input part 10b is outputted); and a fourth N-channel transistor N1 configured as a diode connected between the second output node n2 and the ground terminal. Thus the second output part 30b outputs a second output signal VOP by using the second node n2 as an output node of the differential amplifier.

The third P-channel transistor P0 of the first output part 30a, and the fourth P-channel transistor P3 of the second output part 30b have the same size; and the third N-channel transistor N2 of the first output part 30a, and the fourth N-channel transistor N1 of the second output part 30b have the same size.

To operate the input buffer circuit of FIG. 3 as a rail-to-rail input buffer circuit, the following conditions are preferably satisfied.

Operating current of the inverter circuit constituting the first output part 30a should become twice the operating current of a first inverter circuit of the first input part 10a; and the operating current of an inverter circuit constituting the second output part 30b should become twice the operating current of the second inverter circuit of the second input part 10b. Thus, the current amount flowing in transistors P0 and N2 constituting the first output part 10a is twice the current amount flowing in transistors P2 and N0 of the first input part 10a; and current amount flowing in transistors P3 and N1 constituting the second output part 30b is twice the current amount flowing in transistors P1 and N3 of the second input part 10b.

In the input buffer circuit of FIG. 3 according to the first exemplary embodiment, the first input part 10a and the second input part 10b have P-channel transistors P1 and P2 and complementary N-channel transistors N0 and N3 arranged in a CMOS inverter circuit structure, and thus, when a P-channel transistor P1 or P2 does not operate, the complementary N-channel transistor N0 or N3 operates; and when a N-channel transistor N0 or N3 does not operate, the complementary P-channel transistor P1 or P2 operates. Even though input signals VINP and VINN inputted to the input terminal may have any common mode voltage level (between a ground level VSS and a power source voltage level VCC), operation is valid and the input buffer circuit of FIG. 3 operates as a rail-to-rail input buffer circuit. Further, the first output part 30a and the second output part 30b each have a diode structure, thus can always maintain uniform current and output common mode voltage.

Because the first and second output parts 30a and 30b have a diode structure (P0, P3, N2, N1), the input buffer circuit of FIG. 3 always consumes current, and thus, the power consumption is large.

Figure 4:
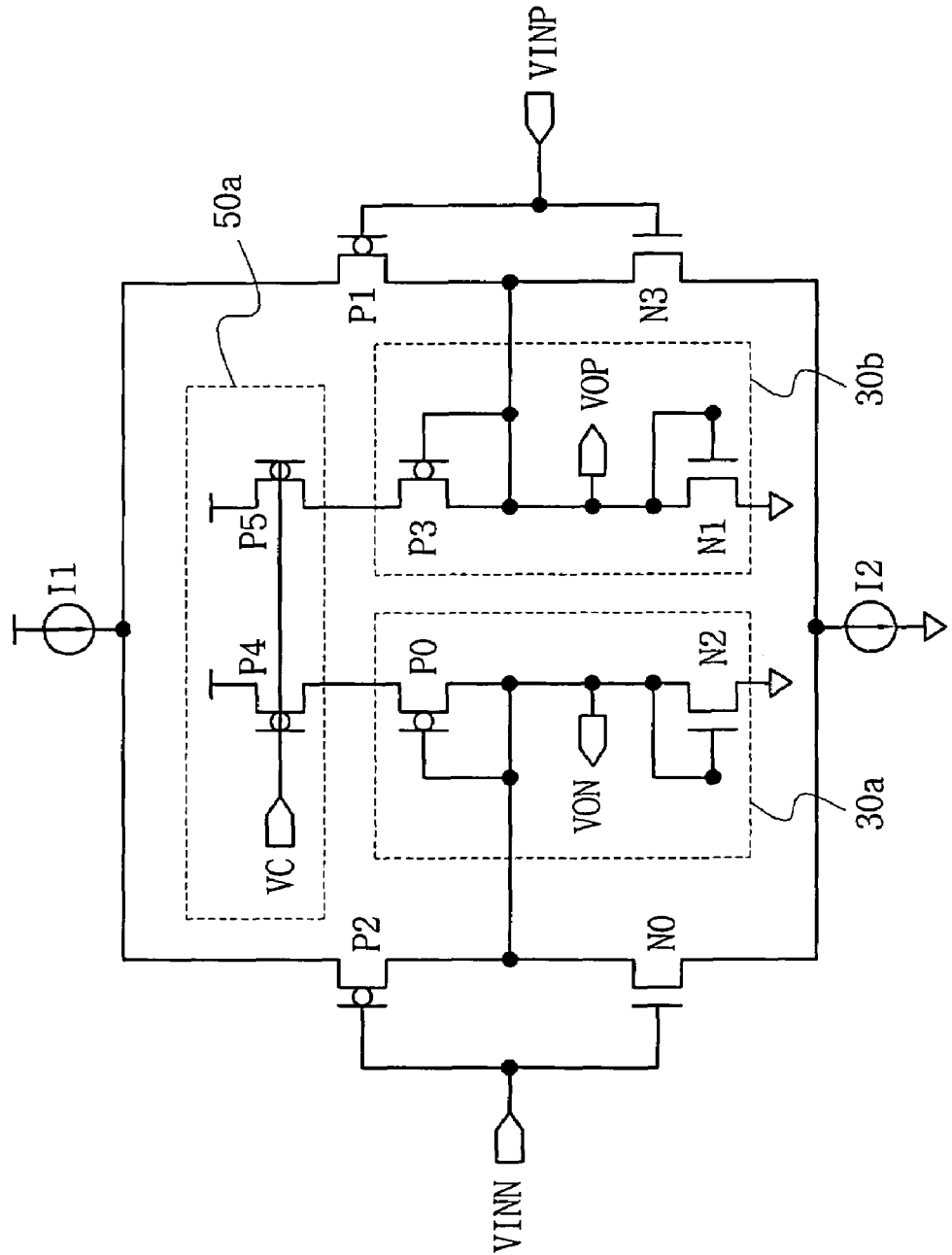
FIG. 4 is a circuit diagram of input buffer circuit according to a second exemplary embodiment of the invention.

FIG. 4 is a circuit diagram of input buffer circuit having a differential amplifier structure, according to a second exemplary embodiment of the invention.

With reference to FIG. 4, an input buffer circuit having a differential amplifier structure according to a second exemplary embodiment differs from the input buffer circuit shown in FIG. 3 only in that a first switching part 50a is added. Thus a redundant description of the elements common to the input buffer circuits of FIGS. 3 and 4 will be omitted, and only the first switching part 50a will be described in detail as follows.

The first switching part 50a is configured to substantially reduce the power consumption (compared to the power consumption of the input buffer circuit of FIG. 3).

The first switching part 50a performs the switching of transistors P0 and P3 connected between the first and second output parts 30a and 30b and a power source voltage terminal VCC by using the control signal VC. Thus, the first switching part 50a controls the operating power source of the first and second output parts 30a and 30b in response to a control signal VC. The first switching part 50a includes: a fifth P-channel transistor P4 connected between the power source voltage terminal VCC and a third P-channel transistor P0 of the first output part 30a; and a sixth P-channel transistor P5 connected between the power source voltage terminal VCC and a fourth P-channel transistor P3 of the second output part 30b. The control signal VC is commonly applied to gates of the fifth P-channel transistor P4 and the sixth P-channel transistor P5. The control signal VC can be applied by an external or internal circuit configured to drive the transistors P4 and P5 closed (ON) only when input signals VINP and VINN are inputted to the input buffer circuit.

Figure 5:
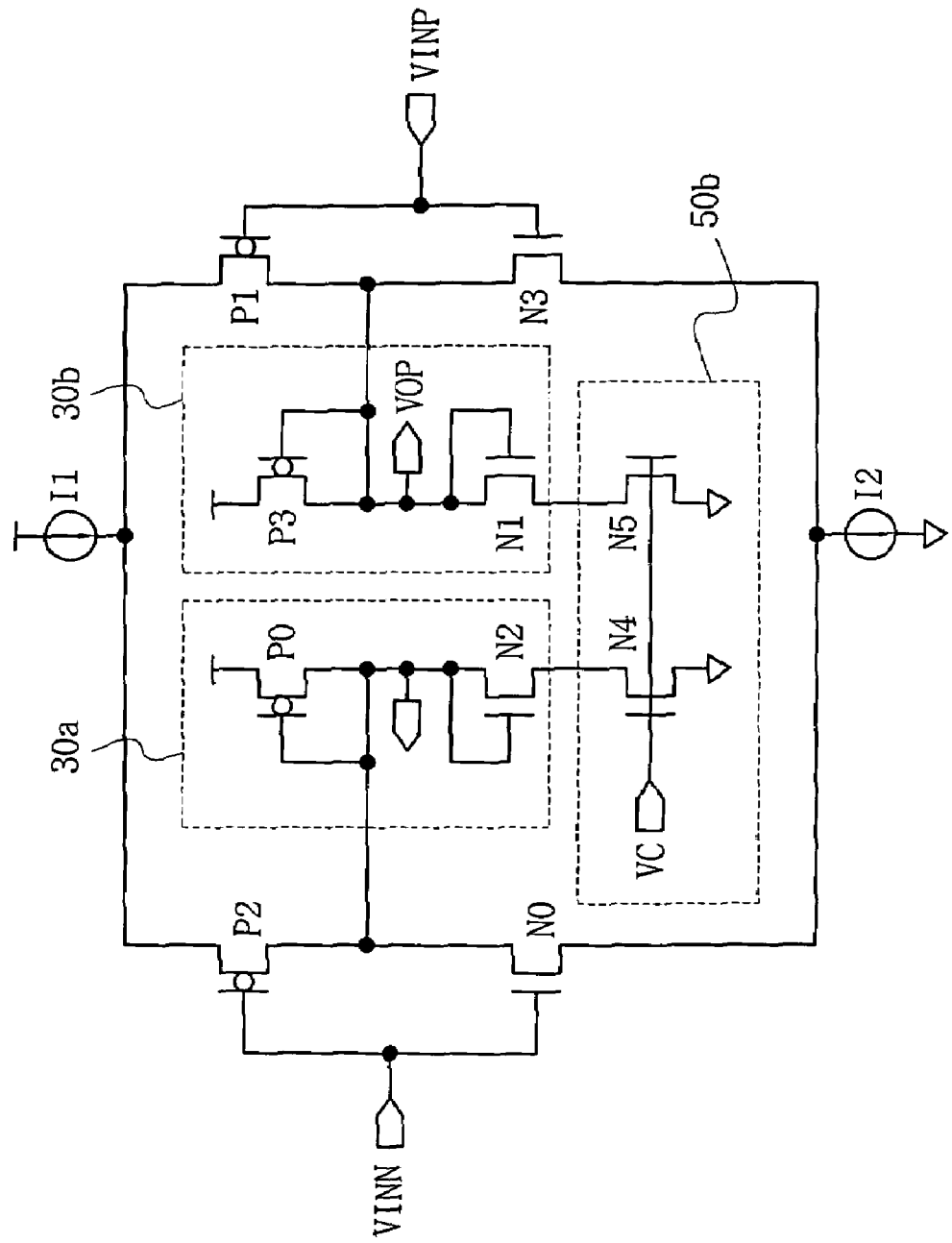
FIG. 5 is a circuit diagram of input buffer circuit according to a third exemplary embodiment of the invention.

FIG. 5 is a circuit diagram of input buffer circuit having a differential amplifier structure, according to a third exemplary embodiment of the invention.

As shown in FIG. 5, an input buffer circuit having a differential amplifier structure, according to a third exemplary embodiment of the invention. The input buffer circuit of FIG. 5 differs from the input buffer circuit of FIG. 3 only in that has a second switching part 50b is added. Thus a redundant description of the elements common to both the input buffer circuits of FIGS. 3 and 5 will be omitted, and only the second switching part 50b will be described in detail as follows.

The second switching part 50b is configured to substantially reduce power consumption compared to the input buffer circuit of FIG. 3.

The second switching part 50b controls the operating power source of the first and second output parts 30a and 30b in response to a control signal VC. The second switching part 50b performs a switching of transistors N1 and N2 connected between the first and second output parts 30a and 30b and a ground terminal, by using the control signal VC. The second switching part 50b includes: a fifth N-channel transistor N4 connected between the third N-channel transistor N2 of the first output part 30a and a ground terminal; and a sixth N-channel transistor N5 connected between the fourth N-channel transistor N1 of the second output part 30b and the ground terminal. The control signal VC is applied to gates of the fifth N-channel transistor N4 and the fifth P-channel transistor N5. The control signal VC can be applied by an external or internal circuit configured to drive the transistors N4 and N5 closed (ON) only when input signals VINP and VINN are inputted to the input buffer circuit.

Figure 6:
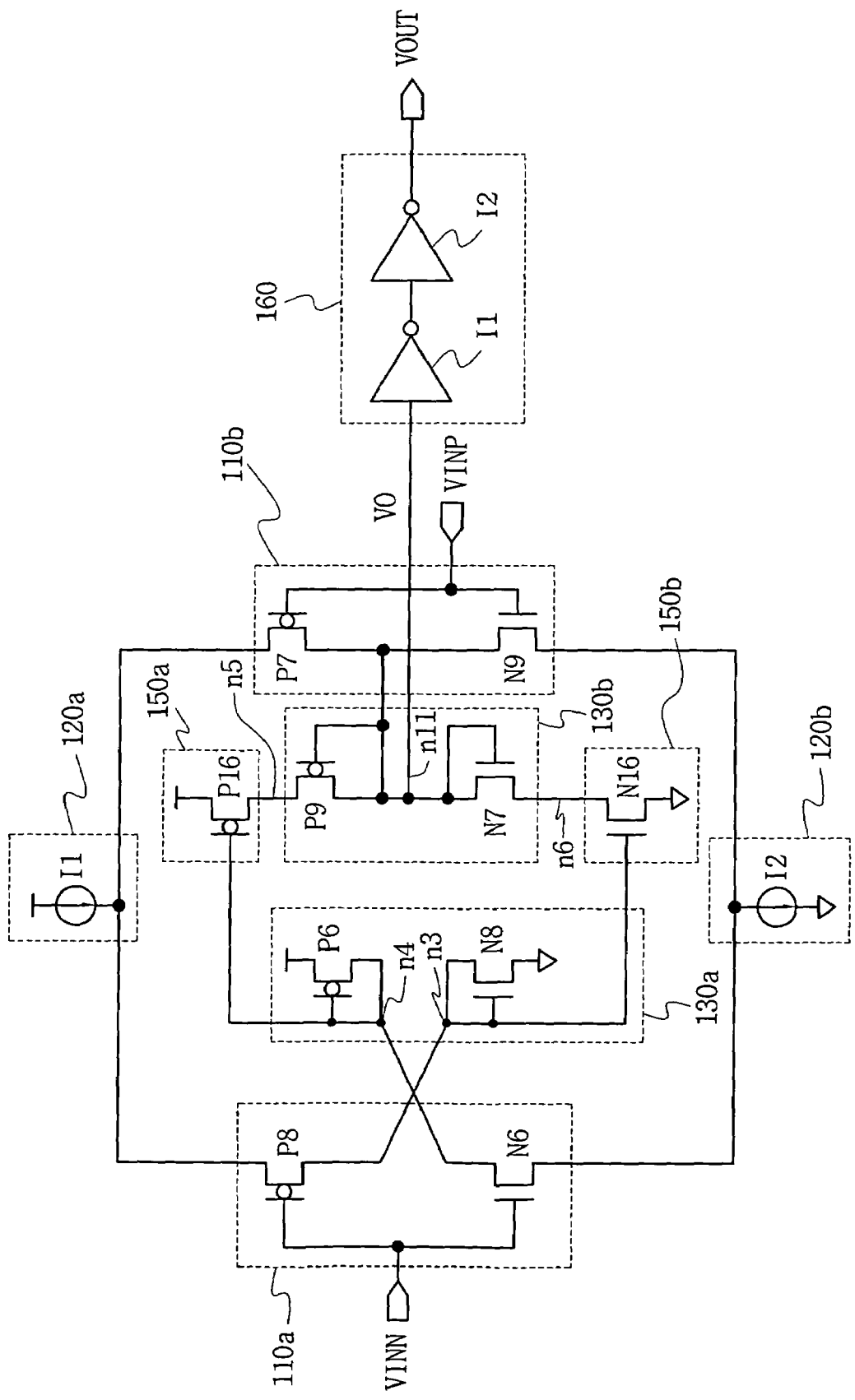
FIG. 6 is a circuit diagram of input buffer circuit according to a fourth exemplary embodiment of the invention.

FIG. 6 is a circuit diagram of input buffer circuit according to a fourth exemplary embodiment of the invention.

With reference to FIG. 6, an input buffer circuit according to a fourth exemplary embodiment includes a current source part 120a, a current sink part 120b, a first input part 110a, a second input part 110b, a first control part 130a and second control parts 150a and 150b, and an output part 130b. Additionally, an output signal buffer circuit 160 (to buffer the output signal VO of the output part 130b) may be provided within or operatively connected to the input buffer circuit.

The current source part 120a includes a current source I1 one end of which is connected to the power source voltage terminal VCC and the other end of which is connected a current source node commonly connected to the first input part 110a and to the second input part 110b. The voltage of the current source node is uniformly maintained, the current source node being connected between the first input part 110a and the second input part 110b and the current source part 120a.

A current sink node forms a connection between one end of the current sink part 120b and the first input part 110a and the second input part 110b. The other end of the current sink part 120b is connected to a ground terminal, and so the voltage of the current sink node connecting the first input part 110a and the second input part 110b and the current sink part 120b is maintained uniformly.

The first input part 110a includes a first P-channel transistor P8 and a first N-channel transistor N6 that are commonly driven by a first input signal VINN (one of the two differential input signals). The first P-channel transistor P8 is connected between the current source part 120a and a node n3, and the first N-channel transistor N6 is connected between a node n4 and the current sink part 120b.

The second input part 110b has an inverter circuit type and is configured to receive a second input signal VINP (the other one of the two differential input signals) and has an output node n11. An inverter circuit (constructed of a second P-channel transistor P7 and a second N-channel transistor N9 that are connected in series with each other), is connected in parallel with the first input part 110a between the current source part 120a (current source node) and the current sink part 120b (current sink node). The second input signal VINP is commonly inputted to gate of the second P-channel transistor P7 and the gate of the second N-channel transistor N9.

The first P-channel transistor P8 of the first input part 110a, and the second P-channel transistor P7 of the second input part 110b have the same size; and likewise, the first N-channel transistor N6 of the first input part 110a, and the second N-channel transistor N9 of the second input part 110b have the same size.

The first control part 130a includes a third P-channel transistor P6 configured to operate as a diode and a third N-channel transistor N8 also configured to operate as a diode. The third P-channel transistor P6 is connected between a power source voltage terminal VCC and the node n4; and the third N-channel transistor N8 is connected between the node n3 and the ground terminal.

The output part 130b is connected to the output node n11 of the second input part 110b, and outputs a single output signal VO to the output node n11 of the output part 130b. The output part 130b includes a fourth P-channel transistor P9 of diode structure connected between a node n5 and the output node n11, and a fourth N-channel transistor N7 of diode structure connected between the output node n11 and a node n6.

The second control part 150a, 150b includes a fifth P-channel transistor P16 that is driven by the same signal that drives the third P-channel transistor P6 (which constitutes the first control part 130a) and that is connected between power source voltage terminal VCC and the node n5; and a fifth N-channel transistor N16 is driven by the same signal that drives the third N-channel transistor N8

(constituting the first control part 130a) and that is connected between the node n6 and a ground terminal. The second control part 150a, 150b is configured to turn on/off (power consumption by) the input buffer circuit by using an internal signal of the input buffer circuit.

The buffer circuit 160 may include two inverters I1 and I2.

In the input buffer circuit of FIG. 6 according to the fourth exemplary embodiment, when one of the P-channel transistors P7 or P8 of the first input part 110a and the second input part 110b, respectively, do not operate, then the complementary one of N-channel transistors N6 or N9 does operate; and conversely, when one of the N-channel transistors N6 or N9 does not operate, the complementary one of the P-channel transistors P7 or P8 does operate. Even though input signals VINP and VINN may have any common mode voltage level (between a ground level VSS and a power source voltage level VCC), operation is valid and the input buffer circuit validly operates as a rail-to-rail input buffer circuit. Further, the output part 130b has a diode structure, thus always maintains a uniform current and uniform output common mode voltage during operation.

For example, in the input buffer circuit according to the fourth exemplary embodiment, in case a voltage level of an input signal is very high: if the voltage level of the first input signal VINN is high enough to turn off the first P-channel transistor P8) then the first P-channel transistor P8 is turned off, and the third N-channel transistor N8 is also turned off. When the voltage between gate and source of the third N-channel transistor N8, and the voltage between gate and source of the fifth N-channel transistor N16, are equal to each other, then the fifth N-channel transistor N16 is also turned off. When the fifth N-channel transistor N16 is turned off, current does not flow in the fourth N-channel transistor N7 of the output part 130b. And, when the voltage level of input signal VINN is very high, current flows through the first N-channel transistor N6 and through the third P-channel transistor P6 having a diode structure, and thus, the fifth P-channel transistor P16 of the second control part 150a is turned on. Thus the input buffer circuit of FIG. 6 effectively becomes a single phase output amplifier that outputs signal VO (e.g., through fourth P-channel transistor P9 having a diode structure in the output part 130b).

Conversely, when the input signal VINN has a very low voltage level, a current flows through the first P-channel transistor P8 and through the third N-channel transistor N8 having a diode structure, and thus, the fifth N-channel transistor N16 of the second control part 150b is turned on. Thus the input buffer circuit of FIG. 6 effectively becomes a single phase output amplifier that outputs signal VO (through fourth N-channel transistor N7 having a diode structure in the output part 130b).

As described above, according to the fourth exemplary embodiment of the invention the operation of the input buffer circuit is controlled by a voltage level of one of the differential input signals, thereby reducing current consumption. Thus, when the signal (VINN) of input terminal becomes a ground level VSS or power source voltage level VCC, a flow of current in the input buffer circuit is cut off and current (power) consumption is reduced.

Figure 7:
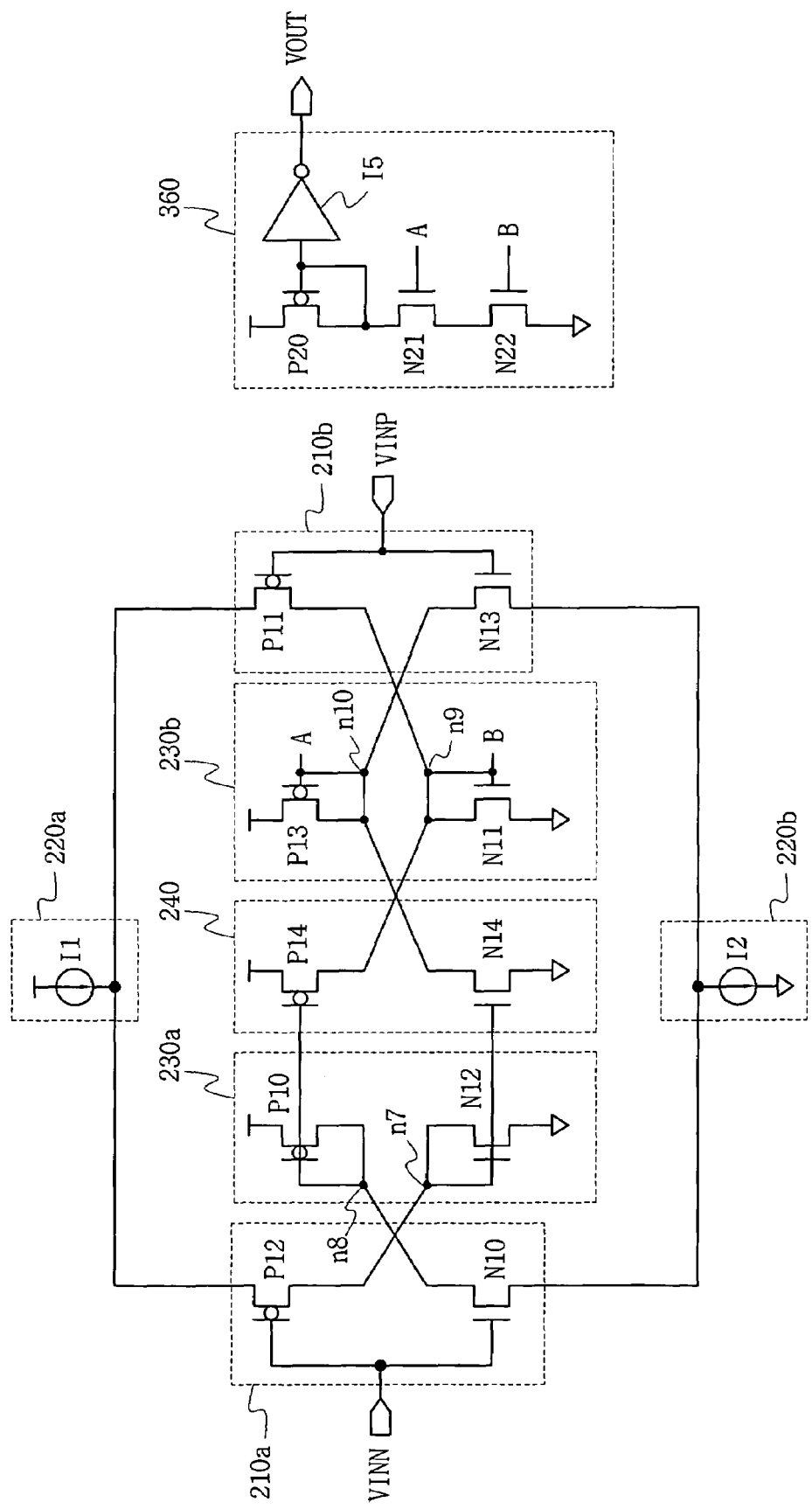
FIG. 7 is a circuit diagram of input buffer circuit according to a fifth exemplary embodiment of the invention.

FIG. 7 is a circuit diagram of input buffer circuit according to a fifth exemplary embodiment of the invention.

As shown in FIG. 7, an input buffer circuit according to a fifth exemplary embodiment includes a current source part 220a, a current sink part 220b, a first input part 210a, a second input part 210b, a first control part 230a, a second control part 240, an output part 230b and an output driver part 360.

The current source part 220a includes a current source I1 one end of which is connected to a power source voltage terminal VCC and the other end of which is connected with the first input part 210a and to the second input part 210b at a current source node. Thus the voltage at the current source node is uniformly maintained, the node forming the connection between the first input part 210a and the second input part 210b and the current source part 220a.

One end of the current sink part 220b is connected by a current sink node to the first input part 210a and the second input part 210 band so the voltage of the current sink node connecting the first input part 210a and the second input part 210b and the current sink part 220b is maintained uniformly. The other end of the current sink part 220b is connected to a ground terminal.

The first input part 210a includes a first P-channel transistor P12 and a first N-channel transistor N10 that are commonly driven by a first input signal VINN (one of the two differential input signals). The first P-channel transistor P12 is connected between the current source part 220a (at the current source node) and a node n7; and the first N-channel transistor N10 is connected between a node n8 and the current sink part 220b (at the current sink node).

The second input part 210b includes a second P-channel transistor P11 and a second N-channel transistor N13 that are commonly driven by a second input signal VINP (the other one of the two differential input signals). The second P-channel transistor P11 is connected between the current source part 220a (at the current source node) and a node n9; and the second N-channel transistor N13 is connected between a node n10 and the current sink part 220b (at the current sink node). The second input part 210b is connected in parallel with the first input part 210a between the current source part 220a (at the current source node) and the current sink part 220b (at the current sink node). The second input signal VINP is commonly inputted to the gate of the second P-channel transistor P11 and to the gate of the second N-channel transistor N13.

The first P-channel transistor P12 of the first input part 210a, and the second P-channel transistor P11 of the second input part 210b have the same size; and likewise, the first N-channel transistor N10 of the first input part 210a, and the second N-channel transistor N13 of the second input part 210b have the same size.

The first control part 230a includes a third P-channel transistor P10 configured to operate as a diode and a third N-channel transistor N12 configured to operate as a diode. The third P-channel transistor P10 is connected between a power source voltage terminal VCC and the node n8; and the third N-channel transistor N12 is connected between the node n7 and the ground terminal.

The output part 230b includes a fourth P-channel transistor P13 configured to operate as a diode and a fourth N-channel transistor N11 configured to operate as a diode. The fourth P-channel transistor P13 is connected between power source voltage terminal VCC and a node n9; and the fourth N-channel transistor N11 is connected between the node n10 and the ground terminal. In this configuration the output part 230b outputs a first output signal A to the node n10, and a second output signal B to the node n9.

The second control part 240 includes a fifth P-channel transistor P14 that is driven by the same signal that drives the third P-channel transistor P10 of the first control part 230a. The fifth P-channel transistor P14 that is connected between the power source voltage terminal VCC and the node n9.

The second control part 240 further includes a fifth N-channel transistor N14 that is driven by the same signal that drives the third N-channel transistor N12 of the first control part 230a and that is connected between the node n10 and ground terminal.

The output driver part 360 includes a sixth P-channel transistor P20, sixth N-channel transistor N21 and seventh N-channel transistor N22, and an inverter I5.

The sixth P-channel transistor P20 is configured to operate as a diode and is connected between power source voltage terminal VCC and the node connecting the inverter I5 to the drain of the sixth N-channel transistor N21.

The seventh N-channel transistor N21 is connected between the node connecting the inverter I5 to the drain of the sixth P-channel transistor P20 and the sixth N-channel transistor N22. The seventh N-channel transistor N21 receives the first output signal A at its gate (connected to node n10).

The sixth N-channel transistor N22 is connected between the seventh N-channel transistor P21 and the ground terminal, and receives the second output signal B through its gate (connected to node n19).

The inverter I5 outputs an output signal VOUT by using the same signal that activates the sixth P-channel transistor P20 configured to operate as a diode.

In the input buffer circuit of FIG. 7 according to the fifth exemplary embodiment of the invention, when one of the P-channel transistors P12 or P11 (in the first input part 210a and the second input part 210b) does not operate, the corresponding one of the N-channel transistors N10 or N13 does operate; and conversely, when one of the N-channel transistors N10 or N13 does not operate, the corresponding one of the P-channel transistors P12 or P11 does operate. Even though input signals VINP and VINN inputted to the input terminal may have any common mode voltage level (between a ground level VSS and a power source voltage level VCC), operation is valid and to the input buffer circuit validly operates as a rail-to-rail input buffer circuit. Further, the output part 230a has a diode structure, thus always maintaining a uniform current and uniform output common mode voltage.

In the input buffer circuit of FIG. 7 according to the fifth exemplary embodiment, a first switching part (not shown, see 50a in FIG. 4) may be further included for a switching off the current flowing through transistors P20, N21 and N22 of the output driver part 360 and the power source voltage terminal VSS, to reduce current (power) consumption. The first switching part may be configured in the form of the switching structure 50a described in the second exemplary embodiment (FIG. 4) of the invention. Additionally, or alternatively, in the input buffer circuit according to the fifth exemplary embodiment (FIG. 7), a second switching part (not shown) may be further included for switching off current flowing between transistors P20, N21 and N22 of the output driver part 360 and the ground terminal, to reduce current (power) consumption. The second switching part may be configured in the form of the switching structure 50b described in the third exemplary embodiment (FIG. 5) of the invention.

Figure 8:
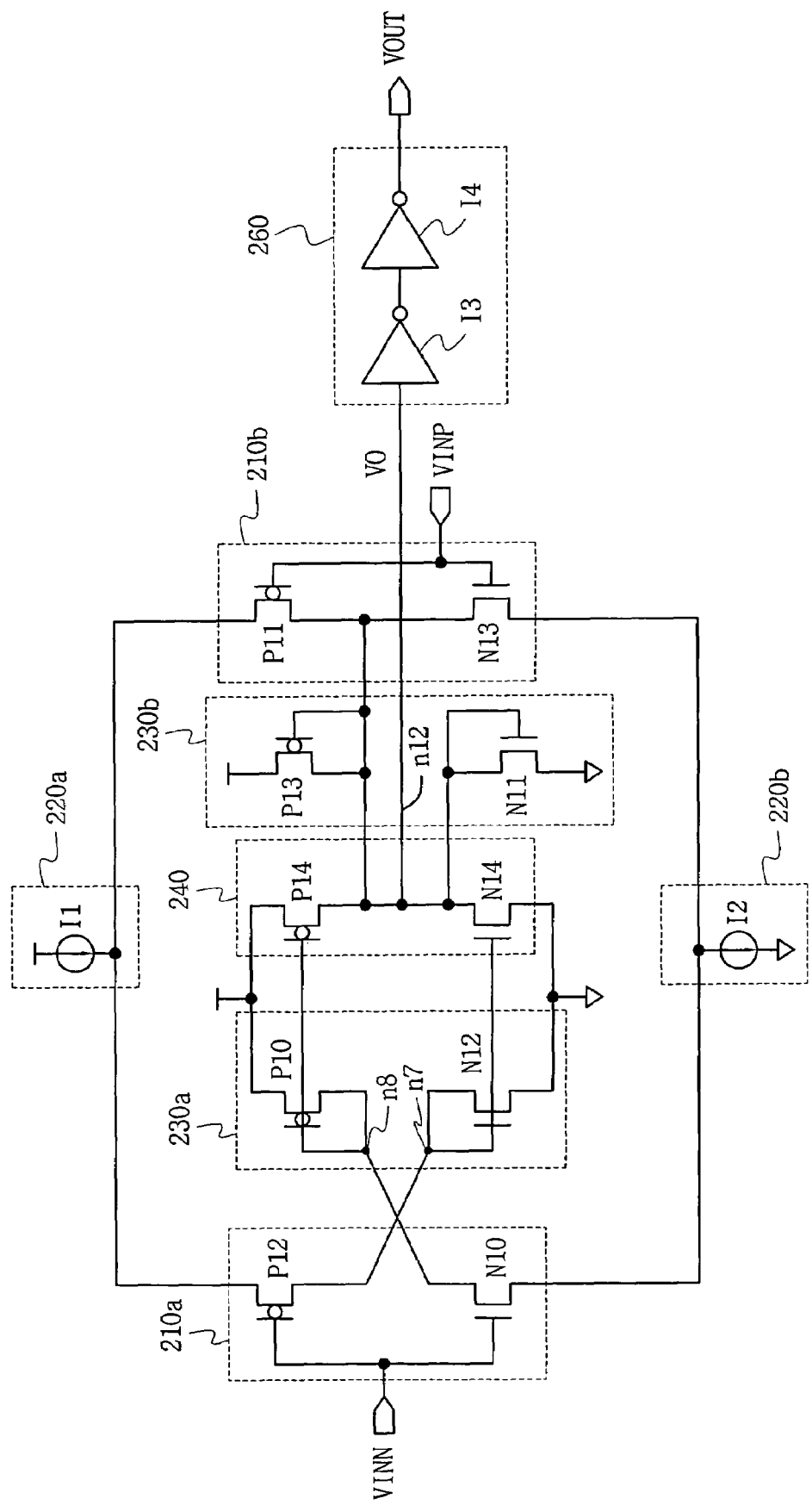
FIG. 8 is a circuit diagram of input buffer circuit according to a sixth exemplary embodiment of the invention.

FIG. 8 is a circuit diagram of input buffer circuit according to a sixth exemplary embodiment of the invention.

As shown in FIG. 8, an input buffer circuit according to a sixth exemplary embodiment is the same as the input buffer circuit of FIG. 7 except that it has a merged node n9 and a node n10 (of the input buffer circuit of the fifth exemplary embodiment shown in FIG. 7) to form one output node n12; and the output driver part 360 is omitted. Hence, the first output signal A and the second output signal B become one output signal VO. Because output signal VO is one signal, thus there is no need in the sixth exemplary embodiment of FIG. 8 for the output driver part 360 that was configured in the fifth exemplary embodiment of FIG. 7.

The input buffer circuit according to the sixth exemplary embodiment of FIG. 8 may additionally include a non-inverting output signal buffer circuit 260 for buffering the output signal VO from the output part 230b. The buffer circuit 260 may include two inverters I3 and I4.

The input buffer circuit of FIG. 8 according to the sixth exemplary embodiment may further include a first switching part (not shown) for a switching off current flowing between the power source voltage terminal VCC and transistor P13 of the output part 230b. The first switching part may be configured in the form the structure 50a described in the second exemplary embodiment (FIG. 4) of the invention.

Additionally, or alternatively, the input buffer circuit according to the sixth exemplary embodiment may further include a second switching part (not shown) for a switching off current flowing between transistor N11 of the output part 230b and the ground terminal. The second switching part may be configured in the form of the structure 50b described in the third exemplary embodiment (FIG. 5) of the invention. The first and/or second switching parts may be provided to reduce current consumption in the output part 230b.

As described above, an input buffer circuit according to exemplary embodiments of the invention can perform rail-to-rail operation and a common mode voltage of output voltage can be uniformly maintained even with any range of a common mode input voltage, and also current (power) consumption can be reduced.

As described above, according to various exemplary embodiments of the invention, an input terminal is constructed of the gates of a P-channel transistor and of an N-channel transistor, and output terminal is constructed of the drains of the P-channel transistor and of the N-channel transistor and a diode structure, thus rail-to-rail operation can be achieved, and an output common mode voltage can be uniform even while any input common mode voltage is inputted. In addition, current consumption can be reduced.

While the present invention has been particularly shown and described with reference to exemplary embodiments thereof, it will be understood by those skilled in the art that various changes in form and details may be made therein without departing from the spirit and scope of the present invention as defined by the appended claims. For example, internal configuration of the circuit may be varied or internal elements of the circuit may be replaced with complementary or other equivalent elements now known or developed in the future. Accordingly, these and other changes and modifications are seen to be within the true spirit and scope of the invention as defined by the appended claims.

What is claimed is:

1. An input buffer circuit configured to receive two differential input signals, the circuit comprising:
   a current source part connected between a power source voltage terminal and a current source node;
   a current sink part connected between a current sink node and a ground terminal;
   a first inverter configured to receive the first one of the two differential input signals and to output the inverted first differential input signal at a first output node;

a second inverter configured to receive the second differential input signal and to output the inverted second differential input signal at a second output node;
a first diode connected between the power source voltage terminal and the first output node;
a second diode connected between the first output node and the ground terminal;
a third diode connected between the power source voltage terminal and the second output node;
a fourth diode connected between the second output node and the ground terminal;
wherein the first inverter is operatively connected between the current source node and the current sink node; and
wherein the second inverter is operatively connected between the current source node and the current sink node.

2. The circuit of claim 1, wherein:
the first diode is a first P-channel transistor configured to operate as a diode; and wherein
the second diode is a first N-channel transistor configured to operate as a diode.

3. The circuit of claim 2, wherein an operating current being approximately twice an operating current of the first inverter flows through the first diode.

4. The circuit of claim 1, further comprising:
a first power switch operated by a control signal, connected between the power source voltage terminal and a power source node; wherein
the first diode is connected between the power source node and the first output node.

5. The circuit of claim 1, further comprising:
a third power switch operated by a control signal connected between a ground node and the ground terminal.

6. The circuit of claim 1, wherein the first inverter and the second inverter are connected in parallel between the current source node and the current sink node.

7. The circuit of claim 1, further comprising:
a switching part for controlling an operating current through the first and second diodes in response to a control signal.

8. An input buffer circuit configured to receive two differential input signals, the circuit comprising:
a current source part connected between a power source voltage terminal and a current source node;
a current sink part connected between a current sink node and a ground terminal;
a first inverter configured to receive the first one of the two differential input signals and to output the inverted first differential input signal at a first output node;
a second inverter configured to receive the second differential input signal and to output the inverted second differential input signal at a second output node;
a first diode connected between the power source voltage terminal and the first output node,
a second diode connected between the first output node and the ground terminal;
a third diode connected between the power source voltage terminal and the second output node;
a fourth diode connected between the second output node and the ground terminal; and
a first power switch operated by a control signal, connected between the power source voltage terminal and a power source node; wherein
the first diode is connected between the power source node and the first output node;
wherein the first inverter is operatively connected between the current source node and the current sink node; and
wherein the second inverter is operatively connected between the current source node and the current sink node;
a second power switch operated by the control signal connected between the power source voltage terminal and the power source node; wherein
the third diode is connected between the power source node and the second output node.

9. An input buffer circuit having two differential input signals, the circuit comprising:
a first P-channel transistor and a first N-channel transistor that are connected to each other at a first output node and connected in series between a current source node and a current sink node, and are commonly controlled by the first one of the two differential input signals;
a second P-channel transistor and a second N-channel transistor that are connected in series between the current source node and the current sink node and are commonly controlled by the second one of the two differential input signals; and
a third P-channel transistor, configured to operate as a diode, connected between a power source voltage terminal and the first output node, and a third N-channel transistor, configured to operate as a diode, connected between the first output node and a ground terminal;
wherein the second P-channel transistor and the second N-channel transistor are connected to each other at a second output node;
and further comprising:
a fourth P-channel transistor, configured to operate as a diode, connected between a power source voltage terminal and the second output node, and a fourth N-channel transistor, configured to operate as a diode, connected between the second output node and the ground terminal.

10. The circuit of claim 9, further comprising: a current source connected between a power source voltage terminal and the current source node; and
a current sink part connected between the current sink node and a ground terminal.

11. The circuit of claim 9, wherein the current amount flowing through at least one of the first P-channel transistor and the first N-channel transistor is approximately twice the current amount flowing through at least one of the third P-channel transistor and the third N-channel transistor.

12. The circuit of claim 9, further comprising a first switching part for switching off a current flowing through the third P-channel transistor and through the third N-channel transistor.

13. An input buffer circuit having two input signals, the circuit comprising:
a first P-channel transistor connected to a current source node and to a first output node; and a first N-channel transistor connected to the first output node and to a current sink node; the first P-channel transistor and the first N-channel transistor being commonly driven by a first input signal among the two input signals;
a second P-channel transistor connected to the current source node and to a second node; and a second N-channel transistor connected to a third node and to the current sink node; the second P-channel transistor and the second N-channel transistor being commonly driven by the second input signal among the two input signals;

a fourth P-channel transistor configured to operate as a diode connected between a power source voltage terminal and the third node; and a fourth N-channel transistor configured to operate as a diode connected between the second node and a ground terminal.

14. The circuit of claim 13, further comprising:
a first diode connected between a first power switch terminal and the first output node, and a second diode connected between the first output node and a second power switch terminal; and
a first power switch that is driven by the signal at the third node and that is connected between a power source voltage terminal and the first power switch terminal; and a second power switch that is driven by the signal at the second node and that is connected between the second power switch terminal and the ground terminal.

15. The circuit of claim 13, further comprising:
a first diode connected between a power source voltage terminal and the first output node, and a second diode connected between the first output node and the ground terminal; and
a fifth P-channel transistor that is driven by the signal at the third node and that is connected between a power source voltage terminal and the first output node, and a fifth N-channel transistor that is driven by the signal at the second node and that is connected between the first output node and the ground terminal.

16. The circuit of claim 13, further comprising a current source connected between a power source voltage terminal and a current source node; and a current sink part connected between the current sink node and a ground terminal.

17. An input buffer circuit having two differential input signals, the circuit comprising:
a current source connected between a power source voltage terminal and a current source node;
a current sink connected between a current sink node and a ground terminal;
a first P-channel transistor and a first N-channel transistor that are commonly driven by the first one of the two differential input signals, the first P-channel transistor being connected between the current source node and a first node, and the first N-channel transistor being connected between a second node and the current sink node; wherein a first output signal is output at the first node and a second output signal is output at the second node;
a second P-channel transistor and a second N-channel transistor that are commonly driven by the second one of the two differential input signals, the second P-channel transistor being connected between the current source node and a third node, and the second N-channel transistor being connected between the current sink node and a fourth node;
a first diode connected between a power source voltage terminal and the second node; and a second diode connected between the first node and a ground terminal;
a third diode connected between the power source voltage terminal and the fourth node; and a fourth diode connected between the third node and a ground terminal; and
a fifth P-channel transistor and a fifth N-channel transistor, the fifth P-channel transistor being driven by the signal at the fourth node and being connected between a power source voltage terminal and the first node; and the fifth N-channel transistor being driven, by the signal at the third node and being connected between the second node and a ground terminal.

18. The circuit of claim 17, further comprising:
an inverter configured to output an output signal of the buffer circuit;
a sixth P-channel transistor configured to operate as a diode, one end of which is between the power source voltage terminal and the input terminal of the inverter;
a sixth N-channel transistor driven by the second output signal at the second node;
a seventh N-channel transistor driven by the first output signal at the first node;
wherein the sixth N-channel transistor and die seventh N-channel transistor are connected in series between the inverter input terminal and the ground terminal.

19. The circuit of claim 18, further comprising a first switch for disconnecting the sixth P-channel transistor from the power source voltage terminal.

20. The circuit of claim 18, further comprising a second switch for the seventh N-channel transistor from the ground terminal.

21. The circuit of claim 17, wherein the first node and the second node are connected to each other forming one output node.

22. The circuit of claim 21, further comprising a non-inverting output buffer circuit to buffer and output the signal at the one output node.

* * * * *